US010163602B2

(12) United States Patent
Shichi et al.

(10) Patent No.: US 10,163,602 B2
(45) Date of Patent: Dec. 25, 2018

(54) ION BEAM SYSTEM

(71) Applicant: Hitachi High-Tech Science Corporation, Tokyo (JP)

(72) Inventors: Hiroyasu Shichi, Tokyo (JP); Shinichi Matsubara, Tokyo (JP); Yoshimi Kawanami, Tokyo (JP)

(73) Assignee: Hitachi High-Tech Science Corporation, Tokyo (JP)

( * ) Notice: Subject to any disclaimer, the term of this patent is extended or adjusted under 35 U.S.C. 154(b) by 0 days.

(21) Appl. No.: 15/635,500

(22) Filed: Jun. 28, 2017

(65) Prior Publication Data

US 2018/0012726 A1 Jan. 11, 2018

(30) Foreign Application Priority Data

Jul. 5, 2016 (JP) .................................. 2016-133700

(51) Int. Cl.
*H01J 37/08* (2006.01)
*H01J 37/18* (2006.01)
*H01J 37/26* (2006.01)

(52) U.S. Cl.
CPC .............. *H01J 37/08* (2013.01); *H01J 37/18* (2013.01); *H01J 37/261* (2013.01); *H01J 2237/0807* (2013.01)

(58) Field of Classification Search
CPC .......... H01J 37/08; H01J 37/09; H01J 37/147; H01J 37/15
USPC ........................ 250/423 R, 424, 423 F, 492.1
See application file for complete search history.

(56) References Cited

U.S. PATENT DOCUMENTS

| 4,638,209 A * | 1/1987 | Asamaki ................. H01J 27/26 313/359.1 |
| 2008/0217555 A1 | 9/2008 | Ward et al. |
| 2009/0152462 A1 | 6/2009 | Ishitani et al. |
| 2009/0173888 A1 | 7/2009 | Shichi et al. |
| 2011/0147609 A1 | 6/2011 | Shichi et al. |
| 2011/0266465 A1* | 11/2011 | Shichi ..................... H01J 27/26 250/492.3 |
| 2012/0132802 A1* | 5/2012 | Arai ........................ H01J 27/26 250/310 |

(Continued)

FOREIGN PATENT DOCUMENTS

| DE | 10 2008 060 270 A1 | 6/2009 |
| DE | 11 2014 007 059 T5 | 7/2017 |
| JP | 2016-027525 A | 2/2016 |

OTHER PUBLICATIONS

German Office Action received in corresponding German Application No. 10 2017 005 565.3 dated Oct. 31, 2017.

*Primary Examiner* — Jason McCormack
(74) *Attorney, Agent, or Firm* — Mattingly & Malur, PC

(57) ABSTRACT

Provided is an ion beam system including a gas field ionization ion source which can obtain a high current sufficient for processing and stabilize an ion beam current. The ion beam system includes a gas field ionization ion source which includes: a vacuum vessel; an emitter tip holder disposed in the vacuum vessel; an emitter tip connected to the emitter tip holder; an extraction electrode opposed to the emitter tip; a gas supply portion for supplying a gas to the emitter tip; and a cold transfer member disposed in the vacuum vessel and transferring cold energy to the emitter tip holder. The cold transfer member has its surface covered with a heat insulating material in order to prevent the gas condensation.

15 Claims, 7 Drawing Sheets

(56) References Cited

U.S. PATENT DOCUMENTS

| | | | |
|---|---|---|---|
| 2014/0036953 A1* | 2/2014 | Kimura | G01J 5/16 374/121 |
| 2015/0008332 A1* | 1/2015 | Notte, IV | H01J 37/08 250/423 F |
| 2015/0047079 A1* | 2/2015 | Kozakai | G01Q 60/10 850/26 |

* cited by examiner

ION BEAM SYSTEM

CLAIM OF PRIORITY

The present application claims priority from Japanese patent application JP 2016-133700 filed on Jul. 5, 2016, the content of which is hereby incorporated by reference into this application.

BACKGROUND

1. Technical Field

The present invention relates to an ion beam system equipped with a gas field ionization ion source.

2. Background Art

The surface structure of a sample can be observed by means of an apparatus which scanningly irradiates a sample with an electron beam and detects secondary charged particles released from the sample. This apparatus is referred to as scanning electron microscope. On the other hand, the sample surface structure can also be observed by means of an apparatus which scanningly irradiates the sample with an ion beam and detects secondary electrons, secondary ions, reflected ions and the like released from the sample. This apparatus is referred to as scanning ion microscope.

The ion beam is more sensitive to information on the sample surface than the electron beam. This is because an excitation region of the secondary electrons is localized closer to the sample surface than that of the electron beam. The electron beam, which has unignorable characteristics of wave, suffers from aberrations induced by diffraction effect. Since ions are heavier than electrons, the ion beam suffers from much less aberrations induced by diffraction effect than the electron beam. Particularly, in a case where a gas field ionization ion source having high luminance is used, the ion beam can be focused on an ultrafine object in comparison to the electron beam.

By the way, the gas field ionization ion source is a device where gaseous molecules are field-ionized by supplying a gas such as helium gas to a metal emitter tip and applying a high voltage of at least several kilovolts to the emitter tip having a tip curvature radius on the order of 100 nm, and the resultant ions are extracted as an ion beam. The present ion source is characterized by capability of forming an ultrafine ion beam because of a narrow width of ion energy distribution and a small sized ion generating source.

The ion beam system irradiates the sample with the ultrafine ion beam so as to detect the secondary electrons (or ions), reflected electrons (or ions), transmitted electrons (or ions) and the like. Thus, the system enables ultrahigh resolution observation of the surface structure of the sample, high-accuracy dimension measurement of the surface structure of a miniaturized semiconductor sample, or elemental analysis of the sample by determining the energy of the electrons (ions) released from the sample or the angle of energy release therefrom. Further, information reflecting an internal structure of the sample can also be obtained by irradiating a thin film sample with the ultrafine ion beam and detecting the ion transmitted through the sample. Furthermore, the irradiation of an ion beam of neon, argon, krypton, xenon, nitrogen, oxygen, carbon monoxide or the like enables ultrafine processing of the sample because of a prominent sputtering phenomenon.

Disclosed in Patent Literature 1 is a charged particle irradiation system which includes: a charged particle beam source for emitting a charged particle beam; a charged particle optical system for focusing the charged particle beam onto a sample; and a cooling mechanism for cooling a tip. The charged particle beam source includes a heat insulation structure member disposed between the tip and a high-voltage terminal and having a heat insulating structure for inhibiting heat inflow from an atmosphere side. In the heat insulation structure member, a heat transfer path from an end on the high-voltage terminal side to an end on the tip side is longer than a direct distance from the end on the high-voltage terminal side to the end on the tip side of the heat insulation structure member.

RELATED ART DOCUMENT

Patent Literature

Patent Literature 1: JP 2016-27525 A

SUMMARY

In order to observe the sample at a high signal-to-noise ratio or to process the sample at a high speed, an ion beam exhibiting a high current density on the sample need be generated. To meet this need, the gas field ionization ion source must be increased in the density of ion emission angle current. To increase the density of ion emission angle current, the molecular density of an ionic material gas (ionizable gas) in the vicinity of the emitter tip may be increased. The molecular density of the gas supplied to the emitter tip is increased with decrease in gas temperature. Hence, what is necessary is to cool the emitter tip to an ultralow temperature. Practically, the ionizable gas in the vicinity of the emitter tip may be maintained at a pressure in the range of $1\times10^{-2}$ to 10 Pa.

A gas field ionization ion source having a nano-pyramid structure at a tip end of the emitter tip has the following problem. If an ionizable gas having a large mass such as neon, oxygen, nitrogen, argon, krypton, or xenon is used in place of hydrogen or helium, the ion beam is increased in sputtering action and hence, is suitable for processing the sample. While an ion beam system using the helium or neon gas has been put to practical application, ion beam systems using the other gas species have not necessarily reached such a level as to be put to practical application although the ion emission has been experimentally confirmed. Particularly, an ion beam processing system using a high-boiling point gas such as argon (boiling point 87K), krypton (boiling point 120K) or xenon (boiling point 156K) as the ion source material has not been put to practical application.

As described above, the emitter tip is cooled in the gas field ionization ion source. Helium used in a conventional gas field ionization ion source had such a low boiling point of 4K that the current could be increased by cooling the emitter tip to the lowest possible temperature. Hence, the gas field ionization ion source was configured to achieve the lowest possible temperature by means of the cooling mechanism of the ion source. However, it was difficult to bring this ion source into practical operation by introducing a krypton gas in place of a helium gas. Since the krypton gas had a boiling point of 120K, a krypton ion current emitted from the emitter tip, which was cooled to a temperature of about 120K, was lower than a helium ion current by a fraction to order of magnitude. Therefore, an ultrafine ion beam having a high current density could not be formed. When the temperature of the emitter tip was further lowered, the ion current tends to increase but the ion current became too instable to be put to practical application. Further, when the temperature of the emitter tip was raised, the ion source was deteriorated in the degree of vacuum at once, sometimes resulting in the stoppage of a turbo-molecular pump of an exhaust system.

Patent Literature 1 teaches that the amount of heat radiation from members at room temperatures toward ultralow temperature areas such as tip, braided copper wire, heat absorption parts and tip holder is reduced by enclosing the components with heat shield. Further, a second heat exchanger is configured to enclose a heat exchanger so as to block the heat radiation to the heat exchanger as well. This is effective to reduce thermal load so that a further lower cooling attainment temperature of the tip is expected. The patent literature suggests that the total amount of the transferred heat and the radiation heat can be limited to about 0.5[W]. However, even the structure of the Patent Literature 1 is incapable of stable generation of a high-current ion beam from the ionizable gas having the high boiling point such as argon, krypton and xenon.

The present invention provides a gas field ionization ion source which can obtain a high current sufficient for processing and stabilize an ion beam current when forming an ion beam of gas species by using high boiling point gases such as argon, krypton, xenon, nitrogen, oxygen and carbon monoxide. The present invention further provides an ion beam system which is equipped with this gas field ionization ion source and can perform high-precision, high-speed processing of an ultrafine region of a sample.

According to an aspect of the present invention, an ion beam system includes a gas field ionization ion source which includes: a vacuum vessel; an emitter tip holder disposed in the vacuum vessel; an emitter tip connected to the emitter tip holder; an extraction electrode opposed to the emitter tip; a gas supply portion for supplying a gas to the emitter tip; and a cold transfer member disposed in the vacuum vessel and transferring cold energy to the emitter tip holder, and has a structure wherein the cold transfer member has its surface covered with a heat insulating material in order to prevent condensation of the gas.

According to another aspect of the present invention, an ion beam system includes the above gas field ionization ion source and further includes: an adhesion member covering a surface of the cold transfer member; and a heat insulating material adhered to the surface of the cold transfer member via the adhesion member, and covering the adhesion member.

According to another aspect of the present invention, an ion beam system includes the above gas field ionization ion source and further includes: a heat insulating material covering a surface of the cold transfer member; a metal material covering a surface of the heat insulating material; and a heating mechanism for heating the metal material.

The present invention provides the ion beam system which is equipped with a gas field ionization ion source and can perform high-precision, high-speed processing of the ultrafine region of the sample by irradiation with an ion beam of argon, krypton, xenon, nitrogen, oxygen, carbon monoxide or the like.

The problems, arrangements and effects other than the above will become apparent from the following descriptions of the embodiments hereof.

DETAILED DESCRIPTION

Figure 1:
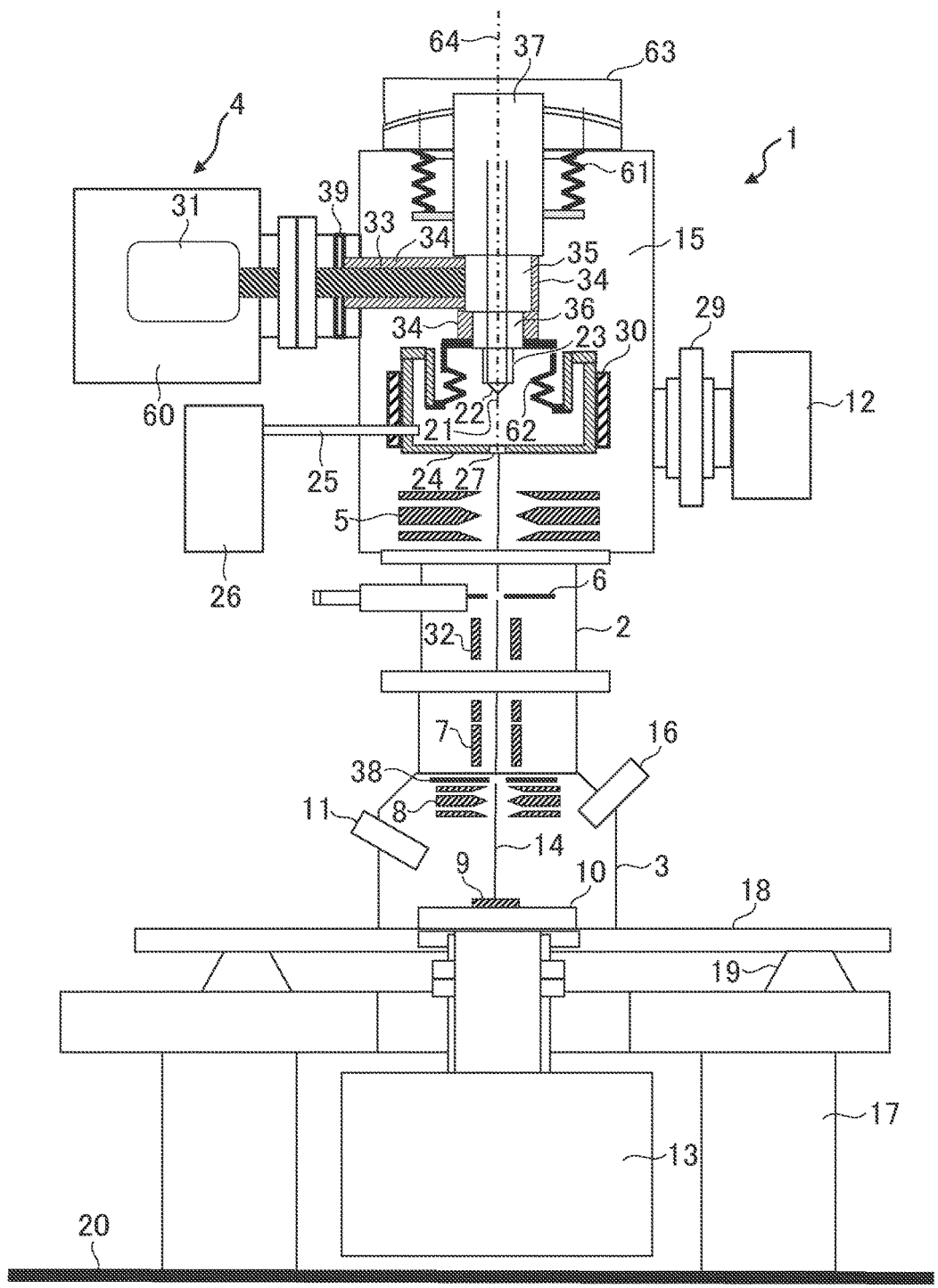
FIG. 1 is a schematic configuration diagram showing an example of an ion beam system.

In a gas field ionization ion source, an emitter tip is cooled as described above. The inventors experimentally produced a gas field ionization ion source to which a krypton gas was applied as the ionizable gas for ion emission. With the pressure of the krypton gas set to $3 \times 10^{-2}$ Pa and the temperature of the emitter tip varied, measurement was taken on emission current. In the case of a temperature of 105K, an ion beam current was 8 pA. In the case of a temperature of 90K, an ion beam current was 10 pA.

When it was tried to continue the experiment with the temperature lowered to 90K or less, a significant drop of the krypton gas pressure made it impossible to take measurement of the emission current. Hence, it was tried to take measurement of the emission current with the gas flow rate increased by two orders of magnitude. Consequently, it was confirmed that in the case of a temperature of 60K, the ion beam current was 50 pA, marking a dramatic increase in emission current. However, it was also found that it was difficult to maintain the gas pressure at a constant level or to stabilize the gas pressure for a long period of time. When the temperature was lowered with the krypton gas pressure maintained constant, it could be measured how the gas pressure falls rapidly. The system was examined to find that when the emitter tip temperature was 90K, a refrigerating machine was cooled to about 56K.

A high-luminance operating condition of the gas field ionization ion source is to lower the temperature of the emitter tip to the lowest possible level, as described above. In a conventional gas field ionization ion source which has a structure where the emitter tip is cooled with cold energy of the refrigerating machine, the refrigerating machine is at the lowest temperature while the emitter tip is at the highest temperature in a cold transfer path between the refrigerating machine and the emitter tip. For example, a transfer portion in vacuum of the refrigerating machine is at 25K, a cold transfer member made of copper is at 35K, the emitter holder is at 55K, and the emitter tip is at 60K. That is, if the emitter tip temperature is to be lowered to the lowest possible level not to induce gas condensation, the ionizable gas is condensed halfway through the cold transfer path, making it difficult to control the gas pressure. Further, in the case where the ionizable gas is condensed, a gas liquefied during the temperature rise of the ion source is vaporized at once and released in the vacuum vessel, so that a significant load is exerted on an exhaust system of the system. Conversely if the emitter tip temperature is raised, the ion source is decreased in luminance. This had made it difficult to operate the conventional gas field ionization ion source under a high-luminance condition, under which the ion source is fundamentally operable.

Thus, the present invention is based on the finding that when cooling the emitter tip to the lowest possible temperature, it is fundamental not to allow the gas condensation halfway through the cold transfer path which is at lower temperatures than the emitter tip. The conventional gas field ionization ion source has failed to increase the current density of the krypton ion beam and the like because the ion source is not designed in consideration of the gas condensation halfway through the cold transfer path.

Based on such a cause investigation, the present invention applies a cold transfer member to the cold transfer path for transferring the cold energy to the emitter tip. The cold transfer member has a temperature-controlled structure where an internal part thereof is maintained at comparatively low temperatures while a surface thereof is maintained at comparatively high temperatures. For example, the surface of the cold transfer member is covered with a heat insulating material such as to inhibit the gas condensation. The inventive structure of the cold transfer path is not required to be applied to the whole length of the cold transfer path but is still effective when applied to a part of the path. It is particularly effective to apply the inventive structure to a part of the cold transfer path that is in the vicinity of the refrigerating machine and has a surface temperature lower than the condensation temperature of the gas.

According to the present invention, the ion source luminance is maximized or the density of ion emission angle current is maximized because the ionizable gas is not condensed in the vacuum vessel while the ions are released from the emitter tip, the temperature of which is maintained at the lowest level. Thus, the ultrafine high-current ion beam can be generated from processing ion species such as argon, krypton, xenon or nitrogen. Hence, ultrafine processing can be accomplished faster than ever before.

Prior to the detailed description of the present invention, individual components and effects thereof are itemized and described.

(1) By way of example, an ion beam system includes a gas field ionization ion source which includes: a vacuum vessel; an emitter tip holder disposed in the vacuum vessel; an emitter tip connected to the emitter tip holder; an extraction electrode opposed to the emitter tip; a gas supply portion for supplying a gas to the emitter tip; and a cold transfer member disposed in the vacuum vessel and transferring cold energy to the emitter tip holder. The cold transfer member has its surface covered with a heat insulating material so as to prevent the gas condensation.

Such a configuration prevents the condensation of the ionizable gas on the surface of the cold transfer member even when the emitter tip is cooled to the lowest temperature within a temperature range that does not allow the ionizable gas to condense. First, the emitter tip is cooled to low temperatures so that an ion emission current is increased. Thus, the density of emission angle current of ion species having a high boiling point is increased. Namely, the ultrafine high-current ion beam can be formed. Accordingly, the ultrafine processing can be done faster than ever before. Further, this ion beam enables the observation of sample surface with higher resolution and at higher S/N ratio. Since the ionizable gas is not condensed on the surface of the cold transfer member, the amount of gas supplied to the emitter tip is stabilized. This leads to a stable ion emission current. Therefore, the ultrafine processing can be done with higher precisions than ever before. Furthermore, the sample surface can be observed at low noise level.

In contrast to the prior art, the present invention does not encounter the problem that when the temperature rises after condensation of the ionizable gas on the surface of the cold transfer member, the condensed gas is vaporized to deteriorate the vacuum degree of the vacuum chamber at once. In some cases, this leads to the breakdown of the conventional exhaust system. The present invention is free from such a trouble and can provide an ion beam system featuring high reliability.

It has been conventionally thought to be improper to cool the emitter tip to below the boiling point of the ionizable gas because the ion current becomes instable if the emitter tip is cooled to below the boiling point of the ionizable gas. The inventors have found out that the problem lies not in cooling the emitter tip to below the boiling point of the ionizable gas, but in the gas condensation on the surface of the cold transfer member.

The inventors have also found out that even though the flow rate of the ionizable gas is constant, the amount of gas supplied to a tip end of the emitter is substantively decreased by the gas condensation on the surface of the cold transfer member. There has been a wrong perception in the prior art that excessive cooling of the emitter tip results in ion current decrease. For this reason, the prior art has failed to achieve sufficient ion current for providing a gas field ionization ion source and an ion beam system which are suitable for ultrafine high-speed processing and ultrahigh resolution observation.

(2) By way of example, an ion beam system includes the gas field ionization ion source according to the section (1) and further includes: an adhesion member applied in a manner to cover the surface of the cold transfer member; and a heat insulating material adhered to the surface of the cold transfer member via the adhesion member so as to cover the adhesion member.

Such a configuration provides the effects described in the section (1). Since the heat insulating material is adhered to the surface of the cold transfer member by means of the adhesion member, the heat insulating material is prevented from separating or cracking when cooled or heated. Further, this configuration is free from a fear of the condensation of the gas entering a gap between the heat insulating material and the cold transfer member. That is, there are provided a gas field ionization ion source and an ion beam system which are suitable for performing the ultrafine high-speed processing and ultrahigh resolution observation with high reliability and stability.

(3) By way of example, an ion beam system includes the gas field ionization ion source according to the section (1) and further includes: the heat insulating material applied in a manner to cover the surface of the cold transfer member; a metal material applied in a manner to cover the surface of the heat insulating material; and a heating mechanism for heating the metal material.

Such a configuration provides the effects described in the section (1). Further, this configuration can controllably uniformize the temperature of the metal surface because of the inclusion of the metal material covering the surface of the heat insulating material, and the heating mechanism for heating the metal material. Namely, the configuration reliably prevents the gas condensation because the temperature of the whole surface is controlled to be at such a level as not to allow the gas condensation. Thus, there are provided a gas field ionization ion source and an ion beam system which are suitable for performing the ultrafine high-speed processing and ultrahigh resolution observation with high reliability and stability.

(4) In the configuration according to the above section (1), (2) or (3), the cold transfer member is a heat exchanger which transfers cold energy of a cooling mechanism into the vacuum vessel.

Such a configuration provides the effects described in the section (1), (2) or (3). Further, since the cold transfer member is the heat exchanger for transferring the cold energy of the cooling mechanism into the vacuum vessel of the ion source, the heat exchanger is free from the gas condensation. The heat exchanger is a cold transfer member which is cooled to the lowest temperature. Therefore, a notable effect can be obtained in cases where only the surface of the heat exchanger is treated in the manner described in the sections (1), (2) and (3).

(5) In the configuration according to the above section (4), the cooling mechanism is a cooling mechanism which circulates a helium gas cooled by the refrigerating machine, while the heat exchanger is cooled with the helium gas.

Such a configuration provides the effects described in the section (4). Further, this configuration reduces transmission of mechanical vibrations of the refrigerating machine to the emitter tip. That is, the configuration enables processing with higher precisions by virtue of the vibration-free emitter tip. Further, the configuration enables observation at higher resolution.

(6) In the configuration according to the above section (4), the cooling mechanism is a cooling mechanism for cooling a helium gas in a helium gas vessel by means of the refrigerating machine, while the heat exchanger is the helium gas vessel.

Such a configuration provides the effects described in the section (4). Further, this configuration reduces the transmission of the mechanical vibrations of the refrigerating machine to the emitter tip. That is, the configuration enables the processing with higher precisions by virtue of the vibration-free emitter tip. Further, the configuration enables the observation at higher resolution.

(7) In the configuration according to the above section (1), (2) or (3), the cold transfer member is a metal thin film having a heat insulating layer adhered to the surface thereof.

Such a configuration provides the effects described in the section (1), (2) or (3). Further, this configuration reduces the transmission of the mechanical vibrations of the refrigerating machine to the emitter tip. That is, the configuration enables the processing with higher precisions by virtue of the vibration-free emitter tip. Further, the configuration enables the observation at higher resolution. What is more, the metal thin film achieves an increased strength of adhesion with the heat insulating layer without an intermediate adhesion layer, thus eliminating the gas condensation on the surface of the metal thin film. What is more, this configuration can achieve cost reduction.

(8) In the configuration according to the above section (1), (2) or (3), the cold transfer member is made of a metal while the heat insulating layer is made of a fluorine resin.

Such a configuration provides the effects described in the section (1), (2) or (3). What is more, this configuration can achieve cost reduction.

(9) In the configuration according to the above section (1), (2) or (3), the cold transfer member is made of a metal while the heat insulating layer is made of ceramics.

Such a configuration provides the effects described in the section (1), (2) or (3). What is more, this configuration can achieve cost reduction.

(10) In the configuration according to the above section (1), (2) or (3), the cold transfer member is made of braided metal wire having the heat insulating layer coated on the surface thereof.

Such a configuration provides the effects described in the section (1), (2) or (3). Further, this configuration reduces the transmission of the mechanical vibrations of the refrigerating machine to the emitter tip. That is, the configuration enables the processing with higher precisions and the observation at higher resolution by virtue of the vibration-free emitter tip. What is more, the braided metal wire achieves an increased strength of adhesion with the heat insulating layer without an intermediate adhesion layer, thus eliminating the gas condensation on the surface of the braided metal wire. What is more, this configuration can achieve cost reduction.

(11) In the configuration according to the above section (1), (2) or (3), the gas supply portion supplies a gas containing any one of neon, argon, krypton and xenon.

Such a configuration provides the effects described in the section (1), (2) or (3). Further, this configuration provides processing or observation with suppressed chemical reaction with the sample.

(12) In the configuration according to the above section (1), (2) or (3), the gas supply portion supplies a gas containing any one of carbon monoxide, oxygen and nitrogen.

Such a configuration provides the effects described in the section (1), (2) or (3). Further, this configuration is adapted to process the sample through chemical reactions.

(13) In the configuration according to the above section (1), (2) or (3), the gas supply portion supplies an argon-based gas for cooling the cold transfer member to 30K or less.

Such a configuration provides the effects described in the section (1), (2) or (3). Further, this configuration is adapted to emit a stable, high-current argon ion beam for ultrafine high-speed sample processing and ultrahigh resolution sample observation.

(14) In the configuration according to the above section (1), (2) or (3), the gas supply portion supplies a krypton-based gas for cooling the cold transfer member to 50K or less.

Such a configuration provides the effects described in the section (1), (2) or (3). Further, this configuration is adapted to emit a stable, high-current krypton ion beam for ultrafine high-speed sample processing and ultrahigh resolution sample observation.

(15) In the configuration according to the above section (1), (2) or (3), the gas supply portion supplies a neon-based gas for cooling the cold transfer member to 25K or less.

Such a configuration provides the effects described in the section (1), (2) or (3). Further, this configuration is adapted to emit a stable, high-current neon ion beam for ultrafine high-speed sample processing and ultrahigh resolution observation.

(16) In the configuration according to the above section (1), (2) or (3), the gas supply portion is capable of supplying at least two types of gases including the krypton gas in a switchable manner, supplying two types of gases by switching between these gases while the emitter tip is maintained at a substantially constant temperature of 60K or less.

(17) In the configuration according to the above section (1), (2) or (3), the gas supply portion is capable of supplying an argon gas and a helium or hydrogen gas in a switchable manner, supplying the argon gas and the helium or hydrogen gas by switching between these gases while the emitter tip is maintained at a substantially constant temperature of 45K or less.

First Embodiment

Figure 2:
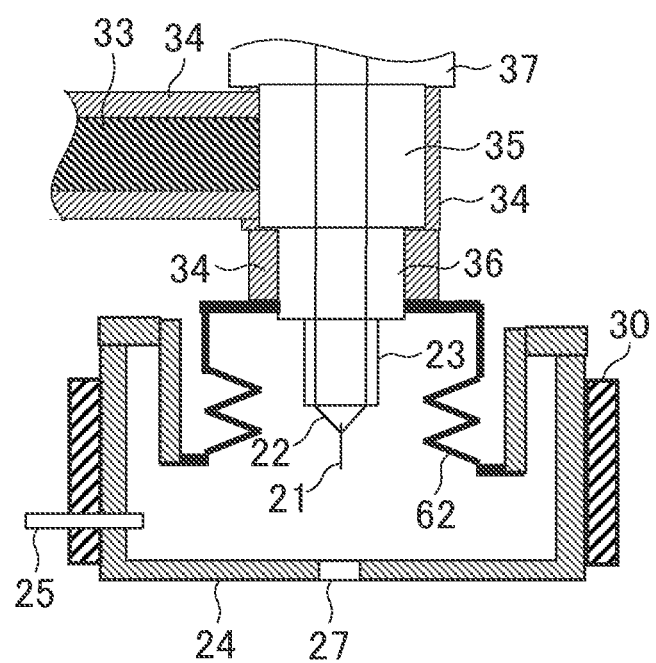
FIG. 2 is an enlarged view of a gas field ionization ion source.

FIG. 1 is a schematic sectional view showing an example of an ion beam system according to a first embodiment hereof. FIG. 2 is a schematic diagram showing a gas field ionization ion source 1 in enlarged dimensions.

The following description is made on an ion beam processing system as an example of the ion beam system. The ion beam processing system of the embodiment includes: a gas field ionization ion source 1; an ion beam irradiation system column 2; a sample chamber 3; a cooling mechanism 4; and a gas supply mechanism 26. The gas field ionization ion source 1, the ion beam irradiation system column 2 and the sample chamber 3 are vacuum vessels. An ionizable gas supplied from the gas supply mechanism 26 is an argon gas.

The gas field ionization ion source 1 includes: a needle-like emitter tip 21; an extraction electrode 24 opposed to the emitter tip and including an opening 27 for passage of ions; a thin wire filament 22; a columnar filament mount 23; an electric insulating column 36; an emitter tip holder 35; and a columnar emitter base mount 37. A vacuum vessel 15 of the gas field ionization ion source 1 is evacuated by an ion-source vacuum exhaust pump 12. A valve 29 capable of vacuum interruption is disposed between the vacuum vessel 15 and the ion-source vacuum exhaust pump 12. The extraction electrode 24 is provided with a heater 30.

The gas field ionization ion source 1 includes an inclination mechanism 63 for changing the inclination of the emitter tip 21. The inclination mechanism is fixed to the emitter base mount 37. The inclination mechanism 63 is used for precisely aligning the direction of an emitter tip end with an ion beam irradiation axis 64. The distortion of the ion beam is reduced by this angular axis adjustment. Bellows 61, 62 are deformed when the emitter tip 21 is inclined. The bellows 62 also functions to allow very little change in the argon pressure around the emitter when the emitter tip 21 is inclined. Gas impurities around the emitter tip can be reduced if the temperature of the extraction electrode 24 is raised to 150° C. by the heater 30.

The ion beam irradiation system includes: a focusing lens 5 for focusing ions emitted from the gas field ionization ion source 1; a first movable aperture 6 for limiting an ion beam 14 through the focusing lens 5; a first deflector 32 for scanning or aligning the ion beam through the first aperture 6; a second deflector 7 for deflecting the ion beam; a second aperture 38 for limiting the ion beam; an objective lens 8 which is an electrostatic ion lens for focusing the ion beam on the sample. The objective lens 8 includes three electrodes.

Provided in the sample chamber 3 are: a sample stage 10 on which a sample 9 is placed; a charged particle detector 11; and an electron gun 16 for neutralizing a charged-up sample during the ion beam irradiation. The sample chamber 3 is evacuated by a sample-chamber vacuum exhaust pump 13. The sample chamber 3 is further provided with a gas gun (not shown) for supplying an etching gas or a deposition gas to the vicinity of the sample. A base plate 18 is mounted on a system support structure 17 via a vibration isolation mechanism 19. The system support structure 17 is placed on a floor 20. The gas field ionization ion source 1, the ion beam irradiation system column 2 and the sample chamber 3 are supported by the base plate 18.

The cooling mechanism 4 serves to cool the emitter tip 21 in the gas field ionization ion source 1. The cooling mechanism 4 includes a refrigerating machine 31 located inside a vacuum vessel 60. The detail of the cooling mechanism will be described hereinafter and an outline thereof is described here. Cold energy generated by the refrigerating machine 31 is transferred to a cold transfer rod 33 as the cold transfer member. The cold transfer rod 33 penetrates through a vacuum partition wall 39 along the way. In FIG. 1, the left side of the vacuum partition wall 39 belongs to the vacuum vessel 60 housing the refrigerating machine 31, while the right side of the vacuum partition wall 39 belongs to the ion source vacuum vessel 15. The surface of the cold transfer rod 33 is covered with a heat insulating material 34 such as to inhibit the condensation of argon gas. The cold transfer rod 33 cools the emitter tip holder 35 connected therewith. The surface of the emitter tip holder 35 is also covered with the heat insulating material 34 such as to inhibit the condensation of argon gas. The emitter tip holder 35 is connected to the filament mount 23 via the electric insulating column 36. The surface of the electric insulating column 36 is also covered with the heat insulating material 34 such as to inhibit the condensation of argon gas. The cold energy is transferred to the emitter tip 21 via the filament 22 fixed to the filament mount 23, thus cooling the emitter tip 21.

Favorable examples of the heat insulating material 34 include ceramics and resins having low thermal conductivities. Preferred ceramics include: steatite (ceramics containing magnesium and silicon oxide); zirconia (zirconium oxide); cordierite (ceramics containing magnesium, aluminum and silicon oxide) and the like. These ceramics have thermal conductivities of 5 W/m·K. or less. Particularly preferred resins include fluorine resins and silicone resins which are usable under low temperatures. By way of example, the cold transfer rod 33 is made of an oxygen-free copper, the emitter tip holder 35 is made of a metal such as copper or stainless steel, the electric insulating column 36 is made of aluminum nitride or ceramics such as alumina, the filament mount 23 is made of alumina, and the filament 22 is made of tungsten.

In a case where the cooling mechanism 4 employs a Gifford-McMahon (GM type) refrigerator or a pulse tube refrigerator, for example, a compressor unit using a helium gas as work gas is installed on the floor 20. The vibrations of the compressor unit are transferred to the system support structure 17 via the floor 20. The vibration isolation mechanism 19 is interposed between the system support structure 17 and the base plate 18 so that high-frequency vibrations of the floor are less prone to be transferred to the gas field ionization ion source 1, the ion beam irradiation system column 2, the vacuum sample chamber 3 or the like. Here, the refrigerating machine 31 and the compressor are cited as the causes of the vibrations of the floor 20. However, the causes of the vibrations of the floor 20 are not limited to these. The vibration isolation mechanism 19 may include vibration-proof rubber, spring, damper or a combination of these.

The characteristic of the emitter tip 21 of the gas field ionization ion source lies in an atom-sized microscopic projection structure. An ion can be generated in the vicinity of one atom at a tip end of the emitter tip by adjusting the strength of an electric field formed at the tip end of the emitter tip 21. Therefore, a region where the ion is emitted or the ion beam source is an extremely narrow region of a nanometer or less. Hence, the ion beam source is increased in the current value per unit area or per unit cube, having high luminance. When a beam from the ion beam source is focused on the sample at one-fold magnification or at a fractional magnification, a beam having a diameter of 0.1 nm to 1 nm can be formed. That is, the ultrahigh resolution observation or ultrafine processing on the order of 0.1 nm to 1 nm is provided.

The microscopic projection structure on the nanometer order based on the atom of the emitter tip 21 typically includes one atom at the tip end thereof and a layer of three to six atoms thereunder. A thin wire of tungsten or molybdenum is used as a material for the emitter tip 21. A method for forming the nano-pyramid structure at the tip end of the emitter tip includes: depositing iridium, platinum, rhenium, osmium, palladium, rhodium or the like on the tip end thereof, followed by heating the emitter tip at high temperature by energizing the filament. Other methods include: field evaporation in vacuum; gas etching; ion beam irradiation; remodeling and the like. According to such a method, the nano-pyramid structure can be formed at the tip end of the tungsten wire or molybdenum wire. In the case of a <111> tungsten wire, the tip end is composed of one or three tungsten atoms or iridium atoms. Otherwise, a wire of tungsten, molybdenum, platinum, iridium, rhenium, osmium, palladium, rhodium or the like is sharpened by etching the wire tip with oxygen gas or nitrogen gas introduced under the influence of an applied voltage. Alternatively, a similar microscopic projection structure can also be formed by remodeling where a voltage is applied to the emitter tip in a heated condition.

In the case where the microscopic projection structure with one atom at tip end is formed using platinum, rhenium, osmium, iridium, palladium, rhodium or the like, the current emitted per unit area or per unit cube, or the ion source luminance can be increased so that the emitter tip is adapted to reduce the beam size on the sample or to increase the current. However, if the emitter tip is sufficiently cooled and supplied with sufficient gas, the atom at the tip end is not necessarily limited to one but the emitter tip with three, six, seven or ten atoms can deliver an adequate performance, in a case where the tip end is composed of four or more and less than ten atoms, in particular, the ion source luminance can be increased and additionally, the emitter tip is capable of stable operation with the tip end atoms less susceptible to evaporation. In this case, as well, the ion beam emitted from the vicinity of one atom reaches the sample.

Figure 3:
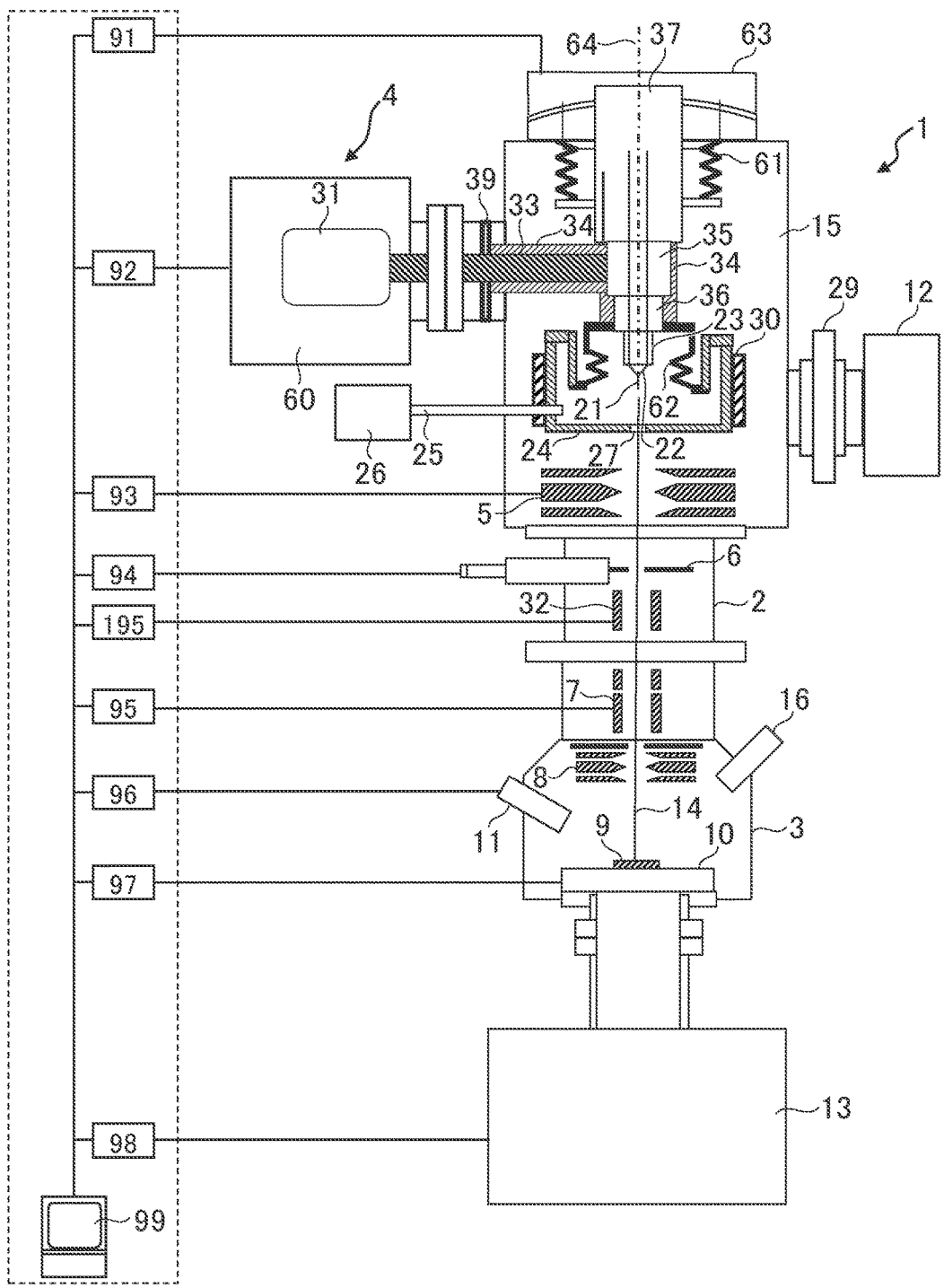
FIG. 3 is a schematic configuration diagram showing an example of a control system of the ion beam system.

FIG. 3 is a schematic diagram showing an example of a control unit of the ion beam system. This control unit includes: an ion source controller 91 for controlling the gas field ionization ion source 1; a cooling mechanism controller 92 for controlling the cooling mechanism 4; a lens controller 93 for controlling the focusing lens 5 and the objective lens 8; a first aperture controller 94 for controlling the first movable aperture 6; a first deflector controller 195 for controlling the first deflector 32; a second deflector controller 95 for controlling the second deflector 7; a sample stage controller 97 for controlling the sample stage 10; a vacuum exhaust pump controller 98 for controlling the sample-chamber vacuum exhaust pump 13; a plurality of electric power sources for applying voltages to electrodes and the like of the sample stage 10 and the charged particle detector 11, and a controller 96 thereof; and an system controller 99 having a calculation processing capability. The system controller 99 includes: an arithmetic processing portion; a storage portion; an image display portion and the like. The image display portion displays image generated from detection signals from the charged particle detector 11, and information inputted by input means.

The sample stage 10 includes: a mechanism for linearly moving the sample 9 in two mutually orthogonal directions in a sample placement face; a mechanism for linearly moving the sample 9 in a direction perpendicular to the sample placement face; and a mechanism for rotating the sample 9 in the sample placement face. The sample stage 10 further includes an inclination function for changing the emission angle of the ion beam 14 to the sample 9 by rotating the sample 9 about the inclined axis. These mechanisms are controlled by the sample stage controller 97 based on a command from the system controller 99.

Next, the description is made on the operations of the gas field ionization ion source of the embodiment. After a lapse of adequate time from the evacuation, the cooling mechanism 4 is operated. As described above, the cold energy generated by the refrigerating machine 31 is transferred in the order of the cold transfer rod 33, the vacuum partition wall 39, the emitter tip holder 35, the electric insulating column 36, the filament mount 23, the filament 22 and the emitter tip 21. Thus is cooled the emitter tip 21. First, a positive high voltage as an ion accelerating voltage is applied to the emitter tip 21. A high voltage is applied to the extraction electrode 24 such that the extraction electrode is at a negative potential relative to the emitter tip 21. Then, a strong electric field is formed at the tip end of the emitter tip 21. When an argon gas is supplied from an ionizable gas supply tube 25 connected to the gas supply mechanism 26, the argon gas is drawn by the strong electric field toward the emitter tip surface. Further, the argon gas reaches the vicinity of the tip end of the emitter tip 21 where the electric field is strongest. Hence, the argon gas is ionized to form an ion beam. The ion beam is introduced to the ion beam irradiation system column 2 through the opening 27 of the extraction electrode 24.

Next, the description is made on the operations of the ion beam irradiation system. The operations of the ion beam irradiation system are controlled based on the command from the system controller 99. The ion beam 14 generated by the gas field ionization ion source 1 passes through the focusing lens 5, and the first aperture 6 and second aperture 38 for limiting the beam, and is focused on the sample 9 placed on the sample stage 10 by means of the objective lens 8. An ion optical condition is defined to focus the beam from the ion beam source into an image on the sample at a magnification of at least 0.5 so as to obtain a high current. The signal from the charged particle detector 11 is transmitted to the system controller 99 as a luminance modulation signal. The system controller 99, in turn, generates a scanning ion microscopic image and displays the resultant image at the image display portion. Thus is accomplished the observation of sample surface.

In the refrigerating machine 31 of the embodiment, a cold stage is cooled to about 10K. Next, the cold transfer rod 33 made of copper having high thermal conductivity is cooled to 15K. In the conventional ion source, the surface of the cold transfer rod 33 is exposed, which induces a phenomenon that the argon gas is condensed on the rod's surface. The ion source of the embodiment has a structure where the emitter tip is enclosed by the extraction electrode 24 and the bellows 62. Outside an ionization chamber confining the argon gas therein, the pressure of argon gas is low, in the prior art, therefore, no attention has been given to the phenomenon that the argon gas is condensed on the surface of the cold transfer rod 33. However, the inventors have found out that in the event of gas condensation, a minor temperature change induces the vaporization of the condensed gas, making the ion beam instable. When the cold transfer rod 33 is raised to high temperatures, a large volume of argon gas is generated, causing damage on an evacuation system in some cases. In this embodiment, the surface of the cold transfer rod 33 was covered with the heat insulating material 34 so as to prevent the gas condensation. The surface of this heat insulating material 34 is maintained a temperature of about 40K. Under the gas pressure used by the ion source of this embodiment, the argon gas is condensed at temperatures of about 38K. On the other hand, the surface of the heat insulating material is maintained at about 40K so that the argon gas is not condensed on the surface of the heat insulating material. Although the boiling point of the argon gas was about 87K, the argon gas was not condensed at temperatures lower than the boiling point thereof under the argon gas pressure at which this ion source operated. It is noted that a case where a small amount of argon gas is condensed in a narrow gap without affecting the stable operation of the ion source is included in the scope of this embodiment.

The cold transfer rod 33 is connected to the emitter tip holder 35. The surface of the emitter tip holder 35 is also covered with the heat insulating material 34 so as to prevent the condensation of argon gas. The surface of this heat insulating material is at a temperature of about 50K. The emitter tip holder 35 is further connected with the filament mount 23 via the electric insulating column 36. At this point, the emitter tip holder 35 is at a temperature of about 30K while the filament mount 23 is at about 40K. The emitter tip 21 connected to a distal end of the filament mount was at a temperature of about 45K, which was lower than the boiling point 87K of the argon gas. However, the argon beam ion could be stably generated.

The existence of gas impurities other than the ionizable gas in the ion source vacuum vessel constitutes a causative factor in destabilization of the ion beam. For this reason, the inside of the vacuum vessel 15 is kept as clean as possible to improve the vacuum degree thereof. For high vacuum purposes, the ion source may sometimes be baked to about 150° C. Therefore, it has been a common practice to use copper for forming the cold transfer rod and to plate the rod surface with gold. The conventional heat insulating material is used for shielding heat radiation from the chamber. When the conventional heat insulating material is disposed on the outside of the cold transfer rod, it has been a common practice to provide a gap between the cold transfer rod and the heat insulating material. In the case where the gap exists between the cold transfer rod and the heat insulating material, the argon gas is prone to enter the gap and to be condensed on the surface of the cold transfer rod. The cold transfer member covered with the heat insulating material for preventing the condensation of argon gas, as suggested by the embodiment, is not employed in the prior art.

According to the embodiment as described above, even when the emitter tip is cooled to a temperature lower than the boiling point of the argon gas but in such a temperature range as not to allow the condensation of argon gas, the argon gas is not condensed on the surface of the cold transfer member. Namely, the argon gas is not condensed on the surfaces of the cold transfer rod and the emitter tip holder, which are made of copper. Further, the emitter tip is cooled to 40K to 45K so that an argon ion emission current is increased. Thus the density of the emission angle current of an argon ion beam is increased. Namely, an ultrafine high-current ion beam can be formed. Therefore, the ion beam system of this embodiment can perform the ultrafine processing faster than the conventional systems. This system also enables the sample surface to be observed at higher resolution and higher S/N ratio. Further, the amount of argon gas supplied to the emitter tip is stabilized because the argon gas is not condensed on the surface of the cold transfer member. Therefore, the argon ion emission current is stabilized. Accordingly, the ion beam system of this embodiment can perform the ultrafine processing with higher precisions than the conventional systems. This system also enables the sample surface to be observed at lower noises.

Further, this embodiment eliminates the problem of the prior art that when the temperature rises after condensation of the ionizable gas on the surface of the cold transfer member, the condensed gas is vaporized to deteriorate the vacuum degree of the vacuum chamber at once. In some cases, this results in the breakdown of the conventional exhaust system. The embodiment is free from such trouble and can provide an ion beam system featuring high reliability.

It has been conventionally thought to be improper to cool the emitter tip to below the boiling point of the argon gas because the ion current becomes instable if the emitter tip is cooled to below the boiling point thereof. The inventors have found out that the problem lies in the condensation of argon gas on the surface of the cold transfer member.

The inventors have also found out that even though the flow rate of the argon gas is constant, the amount of gas supplied to the tip end of the emitter tip is substantively decreased by the gas condensation on the surface of the cold transfer member. There has been a wrong perception in the prior art that excessive cooling of the emitter tip results in the decrease in the ion current. For this reason, the prior art has failed to achieve sufficient ion current for providing the gas field ionization ion source and the ion beam system which are suitable for ultrafine high-speed processing and ultrahigh resolution observation.

If the cold transfer member is made of a metal while the heat insulating layer is made of a fluorine resin or ceramics, there are provided the gas field ionization ion source and the ion beam system which are suitable for performing the ultrafine high-speed processing and ultrahigh resolution observation at low costs.

While the embodiment uses the argon gas, the ionizable gas may be a gas containing any one of carbon monoxide, oxygen and nitrogen. Such an approach achieves an effect that the sample can be processed by chemical reaction. In a case where carbon monoxide is used as the ionizable gas, a typical gas pressure is on the order of $1 \times 10^{-3}$ Pa and the condensation temperature is about 35K. By way of example, the emitter tip at this time may be maintained at a temperature of about 38K, the cold transfer member may be maintained at a temperature of about 20K, and the surface of the heat insulating material may be maintained at a temperature of about 45K. In a case where oxygen is used as the ionizable gas, the typical gas pressure is on the order of $1 \times 10^{-3}$ Pa and the condensation temperature is about 38K. By way of example, the emitter tip at this time may be maintained at a temperature of about 40K, the surface of the heat insulating material may be maintained at a temperature of about 50K, and the cold transfer member may be maintained at a temperature of about 25K. In a case where nitrogen is used as the ionizable gas, the typical gas pressure is on the order of $1 \times 10^{-3}$ Pa and the condensation temperature is about 32K. By way of example, the emitter tip at this time may be maintained at a temperature of about 35K, the surface of the heat insulating material may be maintained at a temperature of about 40K, and the cold transfer member may be maintained at a temperature of about 20K.

When an argon-based gas is introduced into the gas field ionization ion source of the embodiment, the cold transfer member is cooled to a temperature below 30K which is lower than the boiling point of the argon gas, as described above. Thus, a gas field ionization ion source and an ion beam system are provided which are particularly suited for performing the ultrafine processing and ultrahigh resolution observation under irradiation of the argon gas.

While the embodiment uses the argon gas, gases containing other inactive gases such as neon, krypton and xenon are also usable. Such an approach enables the processing and observation to be performed with fewer chemical reactions on the sample.

When a gas mixture of argon gas and hydrogen gas or a gas mixture of argon gas and helium gas is introduced into the gas field ionization ion source of the embodiment, the emitter tip is cooled to a substantially constant temperature higher than the condensation temperatures of the individual gases and 45K or less, such as 40K. Such an approach allows none of the argon gas, helium gas and hydrogen gas to condense. This permits the emitter tip to emit two types of ion beams while hardly changing the emitter tip temperature. The two types of gases can be selected by switching an extraction voltage applied to the emitter tip. This voltage switching can be implemented by software for controlling the electric power source.

In this manner, the ion beams of two or more gas species at least including the argon gas are stably generated and a variety of effects are also obtained. That is, the use of the argon ion beam enables the high-speed processing. In a case where the hydrogen or helium ion beam is emitted on the sample, on the other hand, low damage observation or measurement of the sample is enabled. Further, more detailed information on the sample surface or the inside of the sample can be acquired by comparing an observation image acquired under irradiation of the hydrogen or helium ion beam with an observation image acquired under irradiation of the argon ion beam or by calculation on these observation images. Incidentally, the two species of gases may also be introduced via separate supply tubes.

Second Embodiment

Figure 4:
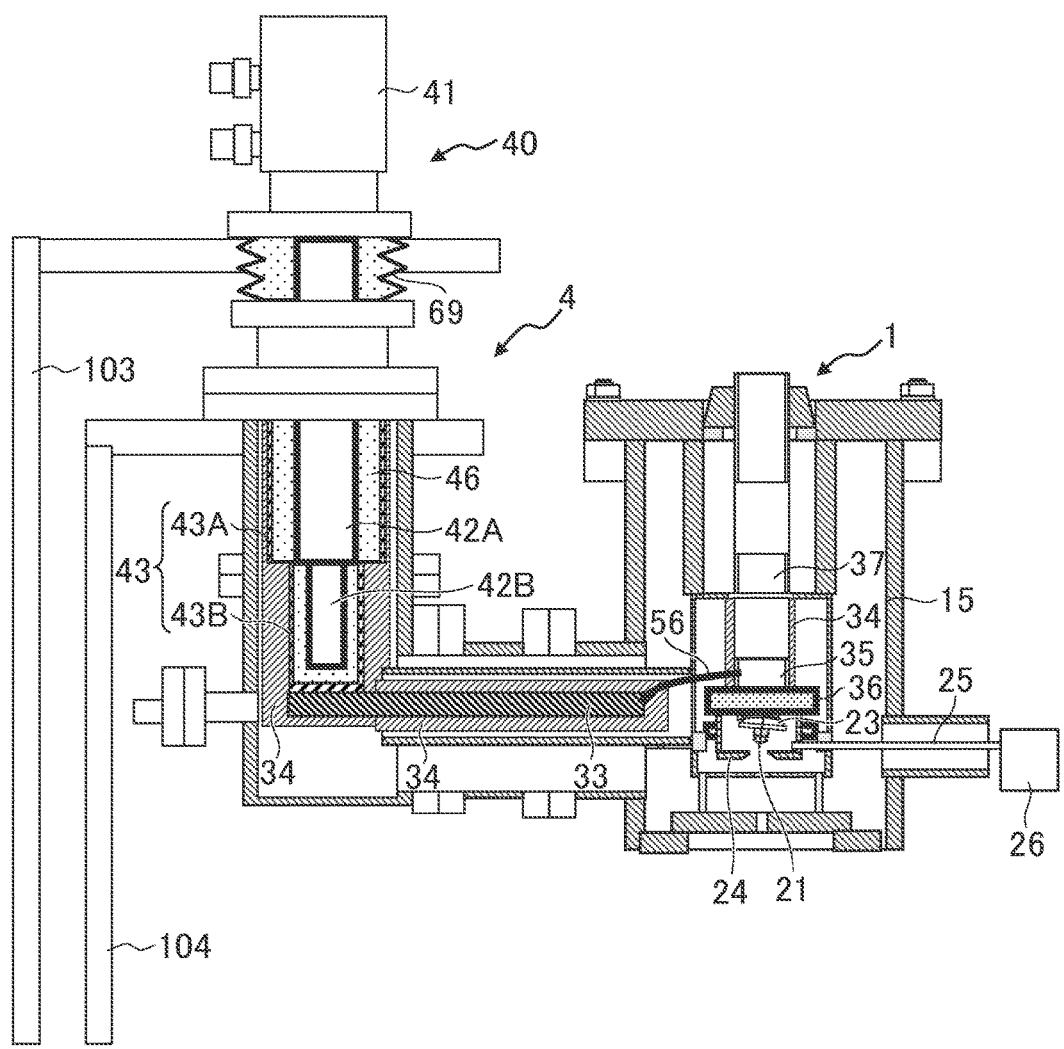
FIG. 4 is a schematic configuration diagram showing an example of the gas field ionization ion source of the ion beam system.

FIG. 4 is a schematic diagram showing another embodiment of the gas field ionization ion source and the cooling mechanism thereof in the ion beam system shown in FIG. 1. Here, the description is made on the cooling mechanism. This embodiment uses a neon gas as the ionizable gas.

In this embodiment, a cooling mechanism combining a GM-type refrigerating machine 40 and a helium gas pot 43 is employed as the cooling mechanism 4 of the gas field ionization ion source 1. The center axis of the GM-type refrigerating machine is aligned parallel to an optical axis of the ion beam irradiation system that passes through the emitter tip 21 of the ion beam system. This structure can achieve both improvement in convergence of the ion beam and improvement in refrigerating function.

The GM-type refrigerating machine 40 includes; a refrigerator body 41; a first cooling stage 42A; and a second cooling stage 42B. The refrigerator body 41 is supported by a support post 103. The first cooling stage 42A and the second cooling stage 42B are configured to be suspended from the refrigerator body 41. An outside diameter of the first cooling stage 42A is larger than an outside diameter of the second cooling stage 42B. The first cooling stage 42A has a refrigerating capacity of about 5 W while the second cooling stage 42B has a refrigerating capacity of about 0.2 W.

An upper end of the first cooling stage 42A is enclosed by a bellows 69. A lower end of the first cooling stage 42A and the second cooling stage 42B are covered by the gas-sealing type helium gas pot 43. The helium gas pot 43 includes: a large-diameter portion 43A configured to enclose the first cooling stage 42A; and a small diameter portion 43B configured to enclose the second cooling stage 42B. The helium gas pot is supported by a support post 104. The support post 104 is supported by the base plate 18 shown in FIG. 1. The bellows 69 and the helium gas pot 43 have sealing structures, in which a helium gas 46 is charged as a heat transfer medium. While the two cooling stages 42A, 42B are surrounded by the helium gas 46, but are not in contact with the helium gas pot 43.

In the GM-type refrigerating machine 40 of the embodiment, the first cooling stage 42A is cooled to about 50K. Therefore, the helium gas 46 around the first cooling stage 42A is cooled to about 70K. The second cooling stage 42B is cooled to about 4K. The helium gas 46 around the second cooling stage 42B is cooled to about 6K. Thus, a lower end of the helium gas pot 43 is cooled to about 6K.

This helium gas pot is disposed in the ion source vacuum vessel 15, also serving as a cold transfer member for transferring the cold energy of the GM-type refrigerating machine 40 to the emitter tip 21. This helium gas pot has its surface covered with the heat insulating material 34 for preventing the condensation of neon gas. This embodiment employed, as the heat insulating material 34, a fluorine resin material having a thickness of 5 mm or more. The surface of this heat insulating material is at a temperature of about 20K. The pressure of the neon gas was about $1\times10^{-3}$ Pa. While the boiling point of the neon is about 27K, a condensation temperature thereof under the neon gas pressure during the operation of this ion source was about 10K. Hence, the neon gas was not condensed at lower temperatures than the boiling point thereof. This is because the condensation temperature of neon under this condition is about 10K and the surface temperature of the heat insulating material 34 covering the helium pot surface and making contact with the neon gas is higher than the condensation temperature of the neon gas. Since the lower end of the pot is at about 6K, the neon gas is condensed when in contact with the pot surface. However, the neon gas is condensed little because the helium gas pot 43 is covered with the heat insulating material 34. It is noted that a case where a minor amount of neon gas is condensed in a narrow gap without affecting the stable operation of the ion source is included in the scope of this embodiment.

On the other hand, the lower end of the helium gas pot 43 is connected to the cold transfer rod 33 made of copper having high thermal conductivity. The cold transfer rod 33 also serves as the cold transfer member and has its surface covered with the heat insulating material 34 for preventing the condensation of neon gas. The heat insulating material 34 is a silicone resin material having a thickness of about 10 mm. While the cold transfer rod 33 is at a temperature of about 15K, the surface of the heat insulating material is at a temperature of about 30K so that the neon gas is not condensed thereon. Further, the cold transfer rod 33 is connected to a braided copper wire 56. The braided wire is formed by braiding together about 1000 thin copper lines of about 0.05 mm in size. Each of the thin lines of the braided wire 56 constituting the cold transfer member has its surface covered with a heat insulating fluorine resin for preventing the condensation of neon gas. Hence, the neon gas is not condensed on the braided wire. Further, the braided wire 56 is connected to the emitter tip holder 35. The emitter tip holder 35 is connected with the filament mount 23 via the electric insulating column 36. This filament mount 23 has its own inclination mechanism for the emitter tip. At this point, the emitter tip holder 35 is at a temperature of about 20K while the filament mount 23 is at a temperature of about 25K.

The emitter tip holder 35 and the electric insulating column 36 also constitute the cold transfer member and each have their surfaces covered with a yttrium-containing zirconium ceramics material having a thickness of about 5 mm, as the heat insulating material 34, so as to prevent the condensation of neon gas. The surface of the heat insulating material on the emitter tip holder 35 is at a temperature of about 45K, while the surface of the heat insulating material 34 on the electric insulating column 36 is at a temperature of about 45K. The emitter tip 21 connected to the tip end of the emitter tip holder is at a temperature of about 25K, which is lower than 27 k as the boiling point of the neon gas but is higher than 10K as the condensation temperature of thereof. Hence, the neon beam is stably generated.

According to this embodiment as described above, even when the emitter tip is cooled to a temperature lower than the boiling point of the neon gas but in such a temperature range as not to allow the condensation of neon gas, the neon gas is not condensed on the surface of the cold transfer member. Namely, the neon gas is not condensed on the surface of the helium gas pot and the surfaces of the cold transfer rod, the braided wire, the emitter tip holder, the electric insulating column, the filament mount and the like which are made of copper. Further, the emitter tip 21 is cooled to low temperatures so that a neon ion emission current is increased. Thus, the density of emission angle current of the neon beam is increased. Namely, an ultrafine high-current ion beam can be formed. Therefore, the ion beam system of this embodiment enables the ultrafine processing to be performed faster than the conventional systems. The system of the embodiment further enables the sample surface to be observed at higher resolution and higher S/N ratio. The amount of neon gas supplied to the emitter tip is stabilized because of the elimination of the condensation of neon gas on the surface of the cold transfer member. Therefore, the neon ion emission current is stabilized. Accordingly, the ion beam system of this embodiment can perform the ultrafine processing with higher precisions than the conventional systems. Further, this system also enables the sample surface to be observed at lower noises. The embodiment shown in FIG. 4 can achieve the other same effects as those described in the first embodiment.

The embodiment employs the GM-type refrigerating machine 40, which may be replaced by a pulse tube refrigerator or a Stirling refrigerator. While the refrigerating machine of the embodiment includes two cooling stages, the refrigerating machine may include a single cooling stage. The number of cooling stages is not particularly limited.

The cooling mechanism of the embodiment cools the helium gas in the helium pot by means of the GM-type refrigerating machine. The cooled helium gas cools the helium pot. Since the cold stages of the GM-type refrigerating machine are separated from the helium pot, the embodiment is also characterized by preventing the mechanical vibrations of the GM-type refrigerating machine from vibrating the helium pot.

When the neon-based gas is introduced into the gas field ionization ion source of the embodiment, the cold transfer member is cooled to a temperature below 20K which is lower than the boiling point of the neon gas, as described above. Thus, a gas field ionization ion source and an ion beam system are provided which are particularly suited for performing the ultrafine processing and ultrahigh resolution observation under neon irradiation.

While the temperature of the emitter tip was about 25K in the above example, the temperature thereof may be further lowered to about 20K, for example. At this time, the temperature of the cold transfer member is maintained at about 8K and the surface temperature of the heat insulating material is maintained at about 15K.

When a gas mixture of neon and hydrogen or a gas mixture of neon and helium is introduced into the gas field ionization ion source of the embodiment, the emitter tip is cooled to a temperature of 30K to 35K, for example. Such an approach allows none of the neon gas, helium gas and hydrogen gas to condense. This permits the emitter tip to emit two types of ion beams while hardly changing the emitter tip temperature. In this manner, the ion beams of two or more gas species at least including the neon gas are stably generated and a variety of effects are also obtained. That is, the use of the neon ion beam enables the high-speed processing. On the other hand, when the hydrogen or helium ion beam is emitted on the sample, low damage observation or measurement of the sample is enabled. Alternatively, more detailed information on the sample surface or the inside of the sample can be acquired by comparing an observation image acquired under irradiation of the hydrogen or helium ion beam with an observation image acquired under irradiation of the neon ion beam or by calculation on these observation images. Incidentally, the two species of gases may be introduced into the ion source via separate supply tubes.

While the above embodiment employs neon as the ionizable gas, neon can be replaced by krypton or xenon. In a case where krypton is used as the ionizable gas, a typical gas pressure is on the order of $1 \times 10^{-3}$ Pa and a condensation temperature is about 56K. By way of example, the temperature of the emitter tip at this time may be maintained at about 60K, the surface temperature of the heat insulating material may be maintained at about 65K, and the temperature of the cold transfer member may be maintained at about 45K.

Figure 5:
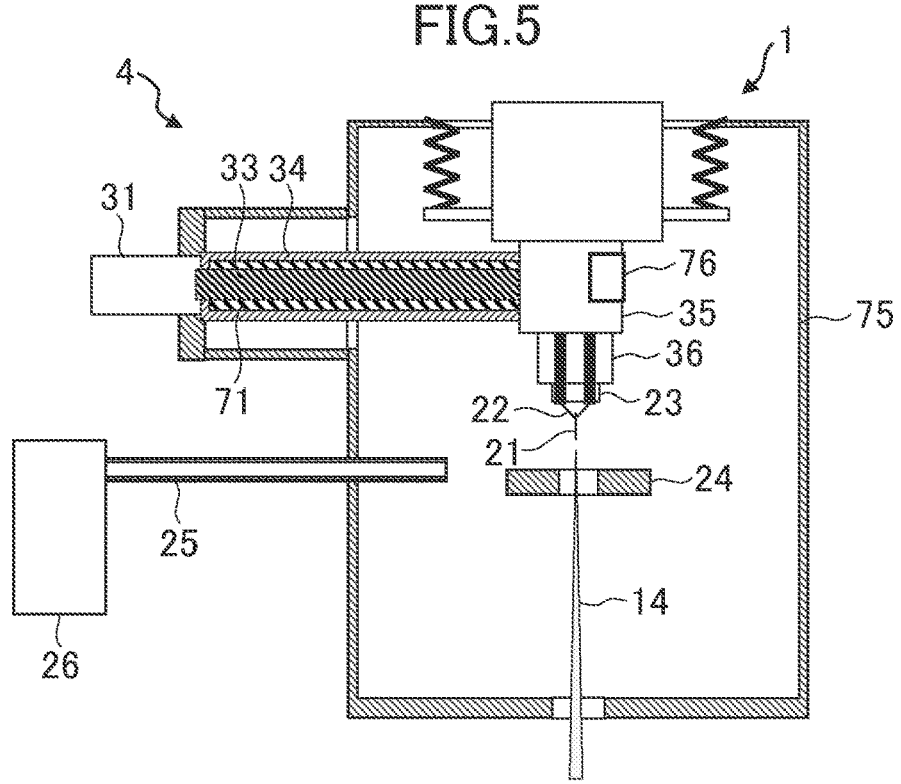
FIG. 5 is a schematic diagram showing a gas field ionization ion source and a cooling mechanism thereof according to an embodiment hereof.

FIG. 5 is a schematic diagram showing another embodiment of the gas field ionization ion source 1 and a cold transfer path of the cooling mechanism 4 thereof in the ion beam system shown in FIG. 1.

The emitter tip holder 35, electric insulating column 36, filament mount 23, filament 22, emitter tip 21 and extraction electrode 24 of the gas field ionization ion source 1 are disposed in an ionization chamber 75. A krypton gas as the ionizable gas, for example, is introduced from the gas supply mechanism 26 into the ionization chamber 75 via the gas supply tube 25 in a manner to provide a krypton gas pressure of about 0.2 Pa. The cold energy of the refrigerating machine 31 is transferred by the cold transfer copper rod 33 to the emitter tip holder 35 of the gas field ionization ion source. The surface of the cold transfer rod 33 is covered with the heat insulating material 34 with an intermediate adhesion layer 71 interposed therebetween. The intermediate adhesion layer 71 is for making the heat insulating material 34 tightly adhere to the cold transfer rod. A chromium-aluminum-yttrium alloy, for example, is used for the intermediate adhesion layer. Yttrium-containing zirconium ceramics was used as the material for the heat insulating material 34.

The temperatures of the cold transfer path from the refrigerating machine 31 to the emitter tip 21 are as follows.

When the temperature of refrigerating machine 31 was 20K, the cold transfer rod 33 was at about 30K, the emitter tip holder 35 was at about 50K, and the emitter tip 21 was at about 60K. The krypton gas used as the ionizable gas has a condensation temperature of about 56K. Under this condition, it is necessary to cover the surfaces of the cold transfer rod 33 and emitter tip holder 35 with the heat insulating material and to raise the surface temperature of the heat insulating material to above 56K in order to prevent krypton condensation. The surface temperature of the heat insulating material 34 covering the surface of the cold transfer rod 33 was about 65K at which the krypton gas was not condensed. The emitter tip holder 35 is provided with a temperature controller 76 including a resistive heater, a temperature sensor and the like. The temperature of the emitter tip 21 is controllable by the temperature controller 76.

The heat insulating material need not necessarily be applied to the full length of the cold transfer path but only need be applied to at least a portion thereof, the temperature of which is equal to or lower than the condensation temperature of the ionizable gas. Accordingly, depending upon the temperature condition of the cold transfer path, the species of the ionizable gas and the like, a configuration may be made such that, as shown in FIG. 5, the heat insulating material 34 covers only the surface of the cold transfer rod 33 via the intermediate adhesion layer 71 while the surfaces of the emitter tip holder 35 and the electric insulating column 36 are not covered with the heat insulating material but exposed. Although FIG. 5 shows the heat insulating material 34 covering the full length of the cold transfer rod 33 via the intermediate adhesion layer 71, the heat insulating material 34 need not necessarily cover the full length of the cold transfer rod 33. Depending upon conditions, the effect to avoid the condensation of the ionizable gas can be obtained by covering only the surface of a portion of the cold transfer rod 33 with the heat insulating material 34 via the intermediate adhesion layer 71, the portion being close to the refrigerating machine 31 and cooled to a lower temperature.

Figure 6:
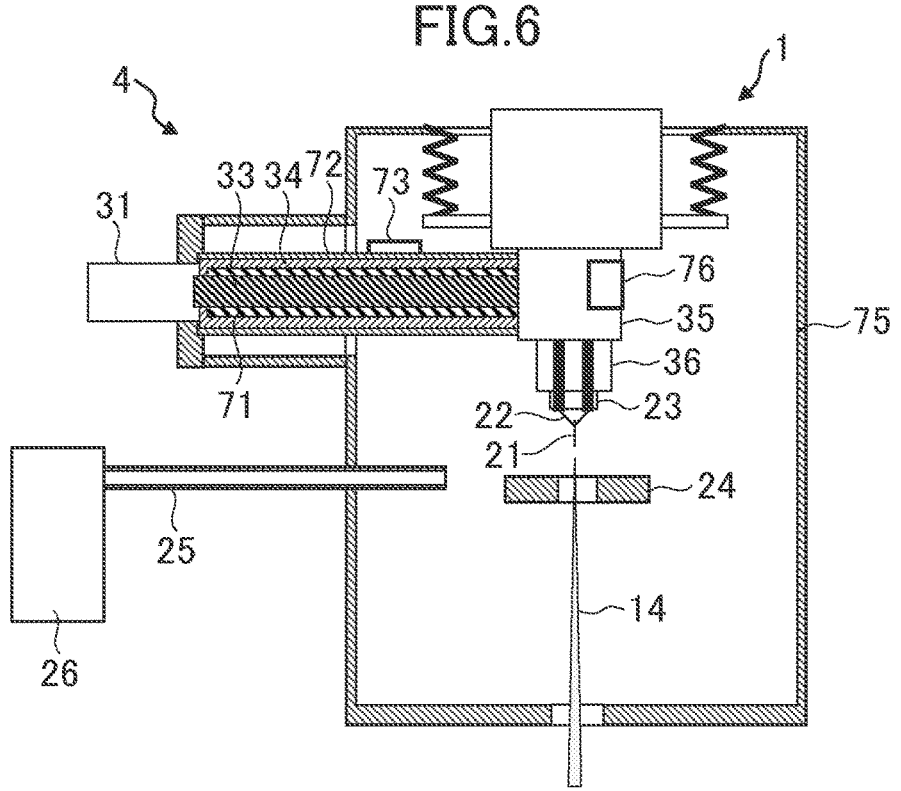
FIG. 6 is a schematic diagram showing a gas field ionization ion source and a cooling mechanism thereof according to an embodiment hereof.

FIG. 6 is a schematic diagram showing another embodiment of the gas field ionization ion source 1 and the cold transfer path of the cooling mechanism 4 thereof in the ion beam system shown in FIG. 1. A nitrogen gas was used as the ionizable gas.

This embodiment differs from the embodiment shown in FIG. 5 in that an aluminum thin film having a thickness of 0.1 mm, as a metal layer 72, is formed on the heat insulating material 34 covering the cold transfer rod 33 via the intermediate adhesion layer 71 and that a resistive heater 73 is disposed in contact with the metal layer 72. The other components are the same as those shown in FIG. 5 and hence, a detailed description thereof is dispensed with.

According to the embodiment, the surface temperature of the cold transfer path for transferring the cold energy by means of the cold transfer rod 33 can be freely controlled by controlling an output from the resistive heater 73. By way of example, when the temperature of the refrigerating machine 31 was 20K, the cold transfer rod 33 was at a temperature of about 30K, the emitter tip holder 35 was at a temperature of about 50K, the emitter tip 21 was at a temperature of about 60K, and the metal layer 72 was at a temperature of about 65K. Therefore, the cold transfer rod 33 of the embodiment can cool the emitter tip 21 to a desired temperature by transferring the cold energy of the refrigerating machine 31 to the emitter tip holder 35 without allowing the condensation of the ionizable gas.

Third Embodiment

Figure 7:
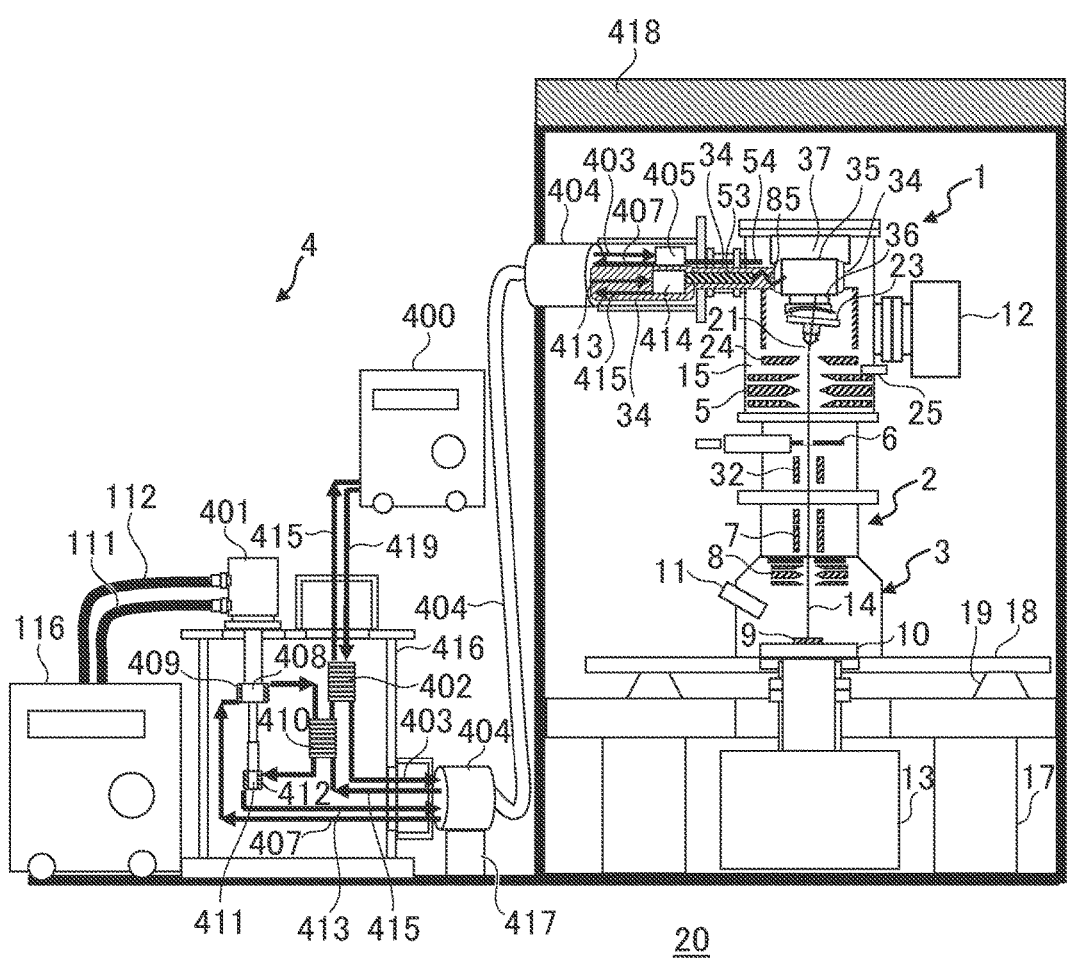
FIG. 7 is a schematic configuration diagram showing an example of the ion beam system.

FIG. 7 is a schematic diagram showing an example of the ion beam system. In this embodiment, a detailed description is made on an example of the cooling mechanism of the ion beam system.

A cooling mechanism 4 of the embodiment adopts a helium circulation system. The gas field ionization ion source 1 used a krypton gas as the ionizable gas. The embodiment has a structure where an area around the emitter tip is enclosed by the cylindrical wall and the extraction electrode so that the pressure of the supplied gas is increased in the area around the emitter tip. The gas supply tube is connected to this ionization chamber.

The cooling mechanism 4 includes: a compressor unit 400; a pulse tube refrigerator 401; a vacuum heat insulation vessel 416; a transfer tube 404 and the like. The pulse tube refrigerator 401 generates the cold energy by circulating the helium gas. A compressor unit 116 is attached to the pulse tube refrigerator. Transfer tubes 111, 112 allow the passage of the helium gas therethrough for circulation of the helium gas. The vacuum heat insulation vessel 416 is evacuated by a vacuum pump, having a vacuum degree of $1 \times 10^{-4}$ Pa Namely, the vacuum heat insulation vessel blocks the heat transfer from the outside by keeping vacuum within the vessel. The vacuum heat insulation vessel 416 contains therein: cooling stages 408, 411 of the pulse tube refrigerator 401; a heat exchanger; helium gas pipes; and the like. The helium gas is circulated through the pipes by the compressor unit 400.

The helium gas is cooled by the pulse tube refrigerator 401 and heat exchangers 402, 409, 410, 412. Pressurized to about 0.9 MPa by the compressor unit 400, the helium gas at a temperature of 300K flows through a pipe 419 into the heat exchanger 402 so as to be cooled a temperature of about 60 k by heat exchange with a low-temperature return helium gas to be described hereinafter. The cooled helium gas is transported through a pipe 403 in the heat-insulated transfer tube 404 and flows into a heat exchanger 405 disposed in the vicinity of the gas field ionization ion source 1. Here, the helium gas cools a thermal conductor 54 thermally integrated with the heat exchanger 405 to a temperature of about 65K, thus cooling a radiation shield in the ion source. The radiation shield is not shown in the figure.

The warmed helium gas flows out of the heat exchanger 405 and flows through a pipe 407 into the heat exchanger 409 thermally integrated with the first cooling stage 408 of the pulse tithe refrigerator 401. The helium gas is cooled to a temperature of about 1.5K by heat exchange with the low-temperature return helium gas to be described hereinafter. Subsequently, the helium gas flows into the heat exchanger 412 thermally integrated with the second cooling stage 411 of the pulse tube refrigerator 401. The helium gas is cooled to a temperature of about 9K and is transported through a pipe 413 in the transfer tube 404. The helium gas flows into a heat exchanger 414 disposed in the vicinity of the gas field ionization ion source 1. In the heat exchanger 414, the helium gas cools a cold transfer rod 53 having high thermal conductivity to a temperature of about 10K. The transfer rod is thermally connected to the heat exchanger 414.

Next, the helium gas warmed by the heat exchanger 414 flows through a pipe 415 and into the heat exchangers 410, 402 in sequence. The helium gas is substantially returned to a normal temperature of about 275K by heat exchange with the aforementioned helium gas. Then, the resultant helium gas flows through the pipe 415 to be recovered by the compressor unit 400. The aforementioned low temperature portion is accommodated in the vacuum heat insulation vessel 416 and is adiabatically connected to the transfer tube 404, the connection of which is not shown in the figure. In the vacuum heat insulation vessel 416, the low temperature portion blocks heat penetration from a room temperature portion by radiation heat by means of a radiation shield plate, multilayer heat insulating material or the like not shown in the figure.

It is noted here that there is a gap between the radiation shield plate and multilayer heat insulating material, and the low temperature portion. This is because a heat insulation effect is provided by vacuum. If a krypton gas is introduced into the vacuum heat insulation vessel 416, the gas is condensed on the surface of the low temperature portion. The conventional placement of the heat insulating material is directed to prevent the heat penetration into the low temperature portion so that no consideration need be given to high boiling point gas. Hence, the heat insulating material has not been used for covering the low temperature portion for preventing the gas condensation. Further, such a vacuum heat insulation vessel need not achieve an ultra-high vacuum and hence, no consideration has been given to baking the ion source to above 150° C. for increasing the vacuum degree thereof. That is, no consideration for preventing the deterioration or cracking of the heat insulating material has been given.

The transfer tube 404 is solidly fixed to and supported by the floor 20 or a support body 417 anchored to the floor 20. Although not shown in the figure, the pipes 403, 407, 413, 415 fixedly supported in the transfer tube 404 by means of a heat insulating material having low thermal conductivity and made of a glass fiber filled plastic are also fixedly supported by the floor 20.

As described above, the cooling mechanism of the embodiment is a mechanism for cooling a cooling target by means of a cold generating portion for generating cold energy by expanding a first high-pressure gas generated by the compressor unit 116, and the helium gas as a second moving coolant cooled by the cold energy of this cold generating portion and circulated by the compressor unit 400.

Figure 8:
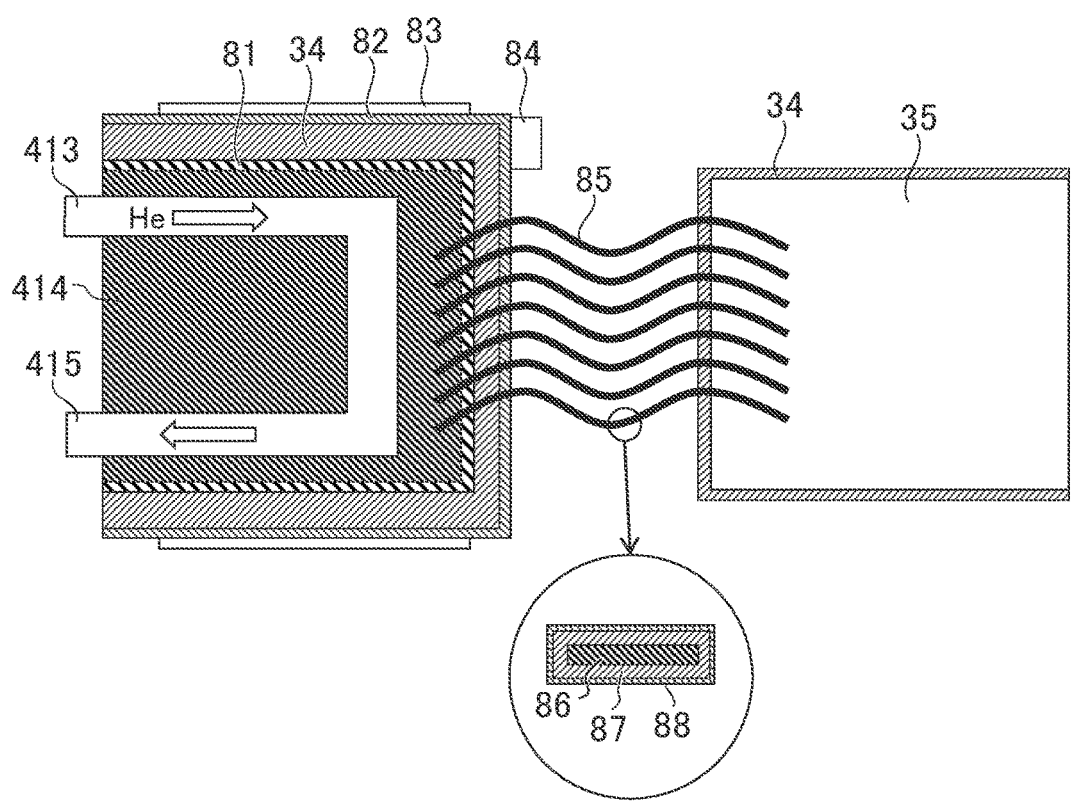
FIG. 8 is a detailed view showing the periphery of a heat exchanger of the gas field ionization ion source of the ion beam system.

FIG. 8 is a schematic diagram showing the details of the heat exchanger 414. The heat exchanger 414 is disposed in the same vacuum vessel 15 as that accommodating the gas field ionization ion source and has its surface covered with the heat insulating material 34 for preventing the condensation of krypton gas. The heat exchanger is made of an oxygen-free copper, having high thermal conductivity. The pipes 413, 415 as a path for the cooled helium gas to flow through are formed in the heat exchanger 414. Namely, the cold energy of the helium cooled by the heat exchanger 414 is transferred to the oxygen-free copper. An adhesion member 81 is disposed between the heat exchanger 414 and the heat insulating material 34. The chromium-aluminum-yttrium alloy, for example, is used for the heat insulating material 34. The adhesion member 81 is used for making the heat insulating material 34 tightly adhered to the cold transfer member and employs, for example, the chromium-aluminum-yttrium alloy. The heat insulating material 34 covers this adhesion member 81, preventing the gas from being adsorbed on the surface of the adhesion member. This approach obviates the separation or cracking of the heat insulating material when the heat exchanger is cooled for achieving a primary function thereof or when the heat exchanger is heated to above 150° C. by baking or the like given to increase the vacuum degree thereof. Further, this approach also eliminates the problem that the gas enters the gap between the heat insulating material and the cold transfer member and is condensed.

The krypton gas is not condensed on the heat exchanger. The heat exchanger is a cold transfer member cooled to the lowest temperature. Hence, a significant effect can be obtained by treating only the surface of the heat exchanger. Further, the surface of the heat insulating material is covered with an oxygen-free copper thin film 82, a part of which is in contact with a heating mechanism 83. The heating mechanism 83 is a resistive heater, for example, an output of which is controllable. A thermometer 84 is mounted to the surface of the oxygen-free copper thin film 82. The thin film can be controlled to be at a predetermined temperature by inputting a temperature measured by the thermometer 84 to the temperature controller. In this embodiment, the surface of the oxygen-free copper thin film 82 is controlled to be at a constant temperature of about 65K. On the other hand, the heat exchanger is maintained at a temperature of about 30K. The heating mechanism 83 may also adopt lamp heating.

Next, the heat exchanger 414 is connected with a cold transfer thin film 85. The cold transfer thin film 85 is formed of a thin film and characterized by transferring very few vibrations of the heat exchanger 414. As shown in an enlarged sectional view in the circle of the figure, this thin film has an inside part made of an oxygen-free copper 86, the periphery of which is covered with a heat insulating thin film 87 made of magnesium-silicon oxide ceramics. The heat insulating thin film is covered with an aluminum thin film 88. The internal oxygen-free copper is maintained at about 45K while the surface of the aluminum thin film is maintained at about 65K. As shown in FIG. 7, the cold transfer thin film 85 is connected to the emitter tip holder 35. The emitter tip holder 35 also has its surface covered with a zirconium oxide as the heat insulating material 34 for preventing the condensation of krypton gas. The emitter tip holder 35 is connected to the filament mount 23 via the electric insulating column 36. The emitter tip 21 is cooled to about 60K.

Under the gas pressure $1 \times 10^{-3}$ Pa used by this gas field ionization ion source 1, the condensation temperature of the krypton gas is about 56K. When cooled to below 56K, krypton is condensed on a solid surface. However, the krypton gas is not condensed because the surfaces of the heat exchanger 414 and cold transfer thin film 85 are maintained at temperatures higher than 65K. Since the emitter tip 21 is cooled to 60K, a large amount of gas is supplied to the tip end of the emitter tip 21, which generates a large amount of ion beam current.

This embodiment can control the metal surface temperature to be uniformized because the embodiment includes the metal material covering the surface of the heat insulating material and the heating mechanism for heating the metal material. The embodiment can reliably eliminate the gas condensation because the overall surface can be controlled to be at such a temperature as not to allow the gas condensation. The embodiment can provide a gas field ionization ion source and an ion beam system suitable for performing the ultrafine high-speed processing and the ultrahigh resolution observation with high reliability and high stability. Further, krypton has a larger atomic weight than argon, providing a higher processing speed per ion current. What is more, krypton is less prone to produce bubbles in the sample because krypton stays in a shallow region in the sample surface.

Although the pulse tube refrigerator 401 causes the vibrations of the floor, the gas field ionization ion source 1, the ion beam irradiation system column 2, the vacuum sample chamber 3 and the like are isolated from the pulse tube refrigerator 401. Further, the pipes 403, 407, 413, 415 connected to the heat exchangers 405, 414 installed in the vicinity of the gas field ionization ion source 1 are not vibrated as solidly fixed to and supported by the floor 20 and the base plate 18 which are hardly vibrated. Furthermore, the pipes are isolated from the vibrations of the floor. Hence, the system is extremely reduced in mechanical vibrations.

The embodiment employs the puke tube refrigerator 401, which may be replaced by the GM-type refrigerating machine or the Stirling refrigerator. While the refrigerating machine of the embodiment includes two cooling stages, the refrigerating machine may include a single cooling stage. The number of cooling stages is not particularly limited. For example, a compact and low-cost ion beam system can be fabricated if a compact Stirling refrigerator with one cooling stage is used as a helium circulation refrigerator having the lowest cooling temperature set to 50K. In this case, a neon gas or oxygen gas may be used in place of the helium gas.

The ion beam system of the embodiment enables high-resolution observation because the emitter tip is less susceptible to the vibrations from the cooling mechanism and a fixing mechanism for the emitter base mount is provided. The inventors have further found out that the noises of the compressor units 116, 400 induce the vibrations of the gas field ionization ion source 1 and deteriorate the resolutions thereof. In this embodiment, therefore, a soundproof cover 418 is provided for spatially separating the compressor unit and the gas field ionization ion source. Thus, the embodiment can reduce the influences of the vibrations induced by the noises of the compressor units and enables the high-resolution observation. Gap elimination is particularly important to achieve sound suppression. The ion beam source has a large optical magnification for the sample so that the vibrations of the emitter tip appear as vibrations of the beam on the sample. Therefore, vibration control is essential for performance improvement of the ion beam system.

When the krypton-based ionizable gas is introduced into this gas field ionization ion source, the cold transfer member is cooled to a temperature below 50K which is lower than the boiling point thereof, as described above. Then, the gas field ionization ion source and the ion beam system are provided which are suitable for performing the ultrafine high-speed processing and the ultrahigh resolution observation under irradiation of krypton.

When a gas mixture of krypton and hydrogen or a gas mixture of krypton and helium is introduced into the gas field ionization ion source of the embodiment, the emitter tip is cooled to a temperature of 60K or less and higher than the condensation temperature of krypton. Such an approach allows none of the krypton gas, helium gas and hydrogen gas to condense, because the condensation temperature of the krypton gas is about 56K while the condensation temperatures of the helium gas and hydrogen gas are 20K or less. This permits the emitter tip to emit two types of ion beams while hardly changing the emitter tip temperature. In this manner, the ion beams of two or more gas species at least including the krypton gas are stably generated and a variety of effects are also obtained. That is, the use of the krypton ion beam enables the high-speed processing. On the other hand, when the hydrogen or helium ion beam is emitted on the sample, low damage observation or measurement of the sample is enabled. Further, more detailed information on the sample surface or the inside of the sample can be acquired by comparing an observation image acquired under irradiation of the hydrogen or helium ion beam with an observation image acquired under irradiation of the krypton ion beam or by calculation on these observation images. Incidentally, the two species of gases may be introduced into the ion source via separate supply tubes.

Fourth Embodiment

An ion beam system of this embodiment basically has the same system configuration as that shown in FIG. 1. It is noted, however, that the embodiment employed a direct coupling pulse tube refrigerator as the cooling mechanism 4. The embodiment used a nitrogen gas as the ionizable gas.

The cooling mechanism of the embodiment has a structure where a cold head of the refrigerator is disposed in the same vacuum vessel as that accommodates the gas field ionization ion source. The cold head of the refrigerator is connected as far as to the emitter tip so as to cool the emitter. The embodiment employs an oxygen-free copper thin wire bundle as a halfway cold transfer member. Each of the thin wires has its surface covered with a heat insulating material. This thin wire bundle is characterized by not transferring the mechanical vibrations of the pulse tube refrigerator to the emitter. The cold head of the refrigerator has its surface covered with the heat insulating material, the surface of which is covered with an oxygen-free copper thin film. A part of the oxygen-free copper thin film is in contact with a resistive heating mechanism. The surface of the oxygen-free copper thin film was controlled to be a constant temperature of about 40K. On the other hand, the inside of the cold head is maintained at about 20K. The thin wire bundle of oxygen-free copper is connected to the emitter mount so as to cool the emitter tip to about 35K.

Under the gas pressure $1 \times 10^{-3}$ Pa used by this gas field ionization ion source 1, the condensation temperature of the nitrogen gas is about 32K. When cooled to below 32K, the nitrogen gas is condensed on a solid surface. However, the nitrogen gas was not condensed because the surface of the cold head was maintained at temperatures higher than 35K. Since the emitter tip was cooled to 35K, a large amount of gas was supplied to the tip end of the emitter, which generated a large amount of ion beam current. This enabled the ultrafine processing to be accomplished faster than the conventional system.

It is noted that the present invention is not limited to the foregoing embodiments and includes a variety of modifications. The foregoing embodiments, for example, are die detailed illustrations to clarify the present invention. The present invention is not necessarily limited to those including all the components described above. A component of one embodiment can be replaced by some component of another embodiment. Further, a component of one embodiment can be added to the arrangement of another embodiment. A part of the arrangement of each embodiment permits addition of a component of another embodiment, the omission thereof or replacement thereof.

The present invention further discloses the following gas field ionization ion sources and ion beam systems.

An ion beam system including a gas field ionization ion source including: a vacuum vessel; an emitter tip holder disposed in the vacuum vessel; an emitter tip connected to the emitter tip holder; an extraction electrode opposed to the emitter tip; a gas supply portion for supplying a gas to the emitter tip; and a cold transfer member disposed in the vacuum vessel and transferring cold energy to the emitter tip holder, the system further including at least two temperature controllers each including a temperature sensor and a heater, and having a structure wherein:
the gas supply portion supplies a krypton gas; and
the emitter tip is maintained at a substantially constant temperature of 60K or less.

An ion beam system including a gas field ionization ion source including: a vacuum vessel; an emitter tip holder disposed in the vacuum vessel; an emitter tip connected to the emitter tip holder; an extraction electrode opposed to the emitter tip; a gas supply portion for supplying a gas to the emitter tip; and a cold transfer member disposed in the vacuum vessel and transferring cold energy to the emitter tip holder,
the system further including at least two temperature controllers each including a temperature sensor and a heater, and having a structure wherein:
the gas supply portion supplies an argon gas; and
the emitter tip is maintained at a substantially constant temperature of 45K or less.

DESCRIPTION OF SYMBOLS

1: gas field ionization ion source
2: ion beam irradiation system column
3: sample chamber
4: cooling mechanism
5: focusing lens
8: objective lens
9: sample
10: sample stage
14: ion beam
15: vacuum vessel
21: emitter tip
22: filament
23: filament mount
24: extraction electrode
26: gas supply mechanism
31: refrigerating machine
33: cold transfer rod.
34: heat insulating material
35: emitter tip holder
36: electric insulating column
37: emitter base mount
40: GM-type refrigerating machine
63: inclination mechanism
81: adhesion member
82: oxygen-free copper thin film
83: heating mechanism
84: thermometer
85: cold transfer thin film
414: heat exchanger

What is claimed is:
1. An ion beam system comprising:
a gas field ionization ion source which includes:
a vacuum vessel;
an emitter tip holder disposed in the vacuum vessel;
an emitter tip connected to the emitter tip holder;
an extraction electrode opposed to the emitter tip;
a gas supply portion for supplying a gas to the emitter tip; and
a cold transfer member disposed in the vacuum vessel and transferring cold energy to the emitter tip holder,
wherein a heat insulating material covers an outer surface of the cold transfer member in order to prevent condensation of the gas.

2. The ion beam system according to claim 1,
wherein the cold transfer member is a metal thin film or a braided metal wire and has a heat insulating layer adhered to the surface thereof.

3. The ion beam system according to claim 1,
wherein the cold transfer member comprises a metal and the heat insulating material comprises a fluorine resin or ceramics.

4. The ion beam system according to claim 1,
wherein the gas is a gas containing any one of neon, argon, krypton and xenon.

5. The ion beam system according to claim 1,
wherein the gas is a gas containing any one of carbon monoxide, oxygen and nitrogen.

6. The ion beam system according to claim 1,
wherein the gas supply portion supplies a gas mixture of krypton gas and other gas or supplies the krypton gas and the other gas by switching between these gases, and
the emitter tip is maintained at a substantially constant temperature higher than the condensation temperatures of the gases and equal to or less than 60K.

7. The ion beam system according to claim 1,
wherein the gas supply portion supplies a gas mixture of argon gas and helium gas or a gas mixture of argon gas and hydrogen gas, and
the emitter tip is maintained at a substantially constant temperature higher than the condensation temperatures of the gases and equal to or less than 45K.

8. An ion beam system comprising:
a gas field ionization ion source which includes:
a vacuum vessel;
an emitter tip holder disposed in the vacuum vessel;
an emitter tip connected to the emitter tip holder;
an extraction electrode opposed to the emitter tip;
a gas supply portion for supplying a gas to the emitter tip; and
a cold transfer member disposed in the vacuum vessel and transferring cold energy to the emitter tip holder,
the system further comprising:
an adhesion member covering an outer surface of the cold transfer member; and
a heat insulating material adhered to the outer surface of the cold transfer member via the adhesion member, and covering the adhesion member.

9. The ion beam system according to claim 8,
wherein the cold transfer member is a metal thin film or a braided metal wire and has a heat insulating layer adhered to the surface thereof.

10. The ion beam system according to claim 8,
wherein the cold transfer member comprises a metal and the heat insulating material comprises a fluorine resin or ceramics.

11. The ion beam system according to claim 8,
wherein the gas is a gas containing any one of neon, argon, krypton and xenon.

12. The ion beam system according to claim 8,
wherein the gas is a gas containing any one of carbon monoxide, oxygen and nitrogen.

13. The ion beam system according to claim 8,
wherein the gas supply portion supplies a gas mixture of krypton gas and other gas or supplies the krypton gas and the other gas by switching between these gases, and
the emitter tip is maintained at a substantially constant temperature higher than the condensation temperatures of the gases and equal to or less than 60K.

14. The ion beam system according to claim 8,
wherein the gas supply portion supplies a gas mixture of argon gas and helium gas or a gas mixture of argon gas and hydrogen gas, and
the emitter tip is maintained at a substantially constant temperature higher than the condensation temperatures of the gases and equal to or less than 45K.

15. An ion beam system comprising:
a gas field ionization ion source which includes:
a vacuum vessel; an emitter tip holder disposed in the vacuum vessel;
an emitter tip connected to the emitter tip holder;
an extraction electrode opposed to the emitter tip;
a gas supply portion for supplying a gas to the emitter tip; and
a cold transfer member disposed in the vacuum vessel and transferring cold energy to the emitter tip holder,
the system further comprising:
a heat insulating material covering an outer surface of the cold transfer member;
a metal material covering an outer surface of the heat insulating material; and
a heating mechanism for heating the metal material.

\* \* \* \* \*